(12) United States Patent
Daskalakis et al.

(10) Patent No.: US 6,361,343 B1
(45) Date of Patent: Mar. 26, 2002

(54) CIRCUIT CARD RETENTION MECHANISM

(75) Inventors: George H. Daskalakis, Forest Grove, OR (US); Brian A. Scott, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/400,024

(22) Filed: Sep. 21, 1999

(51) Int. Cl.[7] .............................................. H01R 13/62
(52) U.S. Cl. ........................................ 439/327; 439/371
(58) Field of Search .................................. 439/325, 326, 439/327, 328, 371

(56) References Cited

U.S. PATENT DOCUMENTS

| | | | |
|---|---|---|---|
| 4,327,835 A | | 5/1982 | Leger |
| 4,498,722 A | * | 2/1985 | Fedder et al. ............... 439/260 |
| 4,525,771 A | | 6/1985 | Hänseler et al. |
| 4,826,447 A | * | 5/1989 | Forker et al. ............... 439/328 |
| 5,218,519 A | | 6/1993 | Welch et al. |
| 5,234,354 A | * | 8/1993 | Smart ......................... 439/326 |
| 5,319,524 A | | 6/1994 | Welch et al. |
| 5,340,328 A | * | 8/1994 | Lee ............................. 439/326 |
| 5,372,518 A | * | 12/1994 | Liu et al. ..................... 439/326 |
| 5,389,000 A | * | 2/1995 | DiViesti et al. ............. 439/157 |
| 5,406,455 A | | 4/1995 | Devenish, III |
| 5,477,426 A | | 12/1995 | Bethurum |
| 5,515,240 A | | 5/1996 | Rodeffer et al. |
| 5,533,631 A | | 7/1996 | Marchetti |
| 5,563,770 A | | 10/1996 | Bethurum |
| 5,563,771 A | | 10/1996 | Bethurum |
| 5,569,043 A | * | 10/1996 | Liu ............................. 439/326 |
| 5,580,203 A | | 12/1996 | Read et al. |
| 5,593,036 A | | 1/1997 | Dyble et al. |
| 5,603,628 A | | 2/1997 | Schapiro, Jr. |
| 5,650,917 A | | 7/1997 | Hsu |
| 6,083,026 A | * | 7/2000 | Trout et al. ................. 439/328 |

* cited by examiner

*Primary Examiner*—P. Austin Bradley
*Assistant Examiner*—Edwin A. León
(74) *Attorney, Agent, or Firm*—Kenyon & Kenyon

(57) ABSTRACT

A circuit card retention mechanism having a base which is mounted around an electrical connecter of a mother board and has various embodiments of an extension piece for securing a circuit card to the electrical connecter of the mother board is presented. The base of the retention mechanism has a number of pointed bites which incline inwardly from the base and, working in opposition to one another, securely fasten the base to the electrical connecter of the mother board. A tie-wrap may be attached to the base and connected by a circuit card hook or a circuit card holder to the circuit card. Alternatively, a retainer clip with a snap lock which snaps onto the circuit card may be utilized.

29 Claims, 4 Drawing Sheets

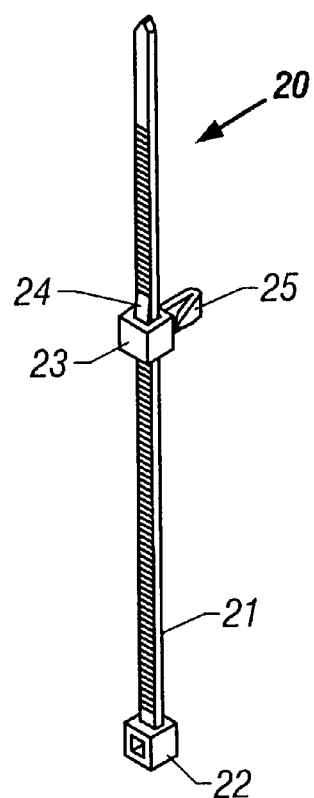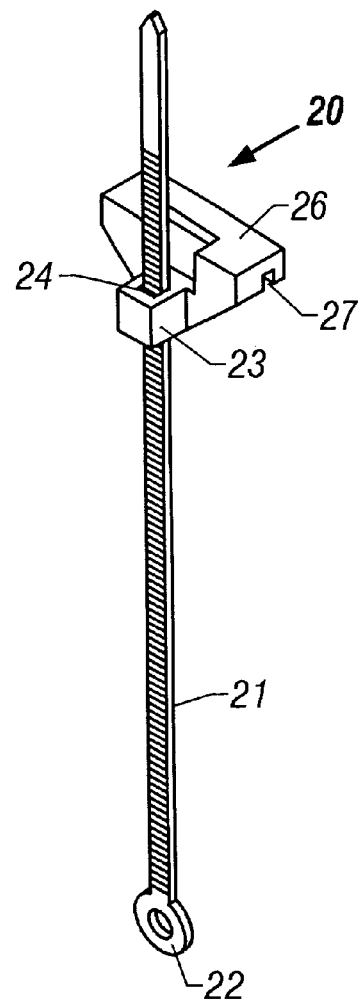
FIG. 3
FIG. 4

CIRCUIT CARD RETENTION MECHANISM

FIELD OF THE INVENTION

The present invention relates to a circuit card retention mechanism, and more particularly, to a retention mechanism that secures a printed circuit card edge connector to an electrical connector mounted on a main circuit board.

BACKGROUND OF THE INVENTION

Today, printed circuit cards are used in many electronic devices, such as computers and telecommunications equipment. In these devices, printed circuit cards are often electrically connected to a main circuit board using connectors that extend from the printed circuit card that mate with connectors located on the main circuit board.

In conventional personal computers (PC's), for example, the main circuit board is generally referred to as the motherboard. The electrical connector located on the motherboard in a PC is generally referred to as a card slot and can receive a variety of printed circuit cards that support, among other things, video displays, serial interface ports, parallel interface ports, computer memory (RAM) and additional data storage. Many of the printed circuit cards provide input and output connections disposed generally on one or more sides of the printed circuit card for connection to external equipment as well as other components internal to the electronic device. Indicator lamps and displays are often disposed on an external face of the printed circuit card to indicate equipment status.

In PC equipment, the printed circuit card electrically mates with the main circuit board when it is installed in a card slot with the printed circuit card connector mated to the main circuit board connector. Printed circuit cards are usually held in place with a fastening means, such as a screw, installed at one end of the card. Even with this fastening means, printed circuit cards are very sensitive to motion and a small degree of motion can dislodge a card and result in equipment malfunction.

Although a manufacturer tests the equipment prior to shipping, cards may partially dislodge during shipping and handling and result in subsequent malfunction. The loss of electrical contact that results from partially dislodged cards is often difficult to diagnose because only some of the electrical contacts between the printed circuit card and the main circuit board are lost. Thus, connection between the circuit card and the main circuit board is not completely lost but only impaired, which can be difficult to diagnose. This often leads to calls from dissatisfied customers requesting manufacturer assistance in debugging equipment failures. This extended involvement with the customer increases manufacturer costs and decreases customer confidence in the underlying equipment.

Several patents have issued in an attempt to cope with some of these problems. For example, U.S. Pat. No. 5,650, 917, issued to Hsu on Jul. 22, 1997, relates to a Central Processing Unit (CPU) mounting structure that includes a U-shaped mounting frame mounted on an electrical connector that receives a CPU card. The CPU card is held in the U-shaped mounting frame by two holding down devices, i.e., screws. The mounting structure, which is intended for use with CPUs, makes unusable a sizeable amount of space on the circuit board as the U-shaped structure extends on three sides of the board. The U-shaped structure also does not allow interface access to the printed circuit card on the sides.

Another example, U.S. Pat. No. 4,826,447, issued to Forker et al. on May 2, 1989, relates to a retainer for locking a printed circuit board with an edge connector that is directly soldered to the conductive paths on a second circuit board. The circuit board is permanently connected to the connector and is removable only after disengaging the retainer and de-soldering the electrical connections to the second circuit board. The retainer, which does not allow interface access to the printed circuit card on the sides, requires a large surface area of potentially usable circuit board space.

Thus, as can be seen, there is a need for a sturdy and reliable printed circuit card retention mechanism that is easy to engage and disengage and does not require de-soldering of connections. There is a further need for a printed circuit card retention mechanism that does not damage the printed circuit card when the retention mechanism is engaged and disengaged. There is yet a further need for a printed circuit card retention mechanism that occupies a minimum of the usable surface area on the printed circuit card and allows for access to connectors on both sides of the printed circuit card.

SUMMARY OF THE INVENTION

Accordingly, the present invention is directed to a circuit card retention mechanism having a base which fits over an end of an electrical connector of a motherboard and an extension piece which is connected to the base and which secures to a circuit card. The base is constructed comprising a pair of lateral wall pieces diametrically opposed and facing one another, a crosspiece which integrally connects the pair of lateral wall pieces at an end, and a support piece integrally connected to and extending outwardly from a bottom portion of the crosspiece. The extension piece can take the form of either a tie-wrap or a retainer clip.

Dependant upon what form the extension piece takes, the base can also further comprise at least one cutout in each one of the pair of lateral wall pieces and at least one pointed bite positioned in each one of the at least one cutouts and which is flexibly biased towards the electrical connector, or can secure to the motherboard itself The present invention and its features and advantages will become more apparent from the following detailed description with reference to the accompanying drawings.

BRIEF DESCRIPTION OF THE DRAWINGS

FIG. 3 illustrates a tie-wrap which fits onto the base of FIG. 1 and secures the circuit card edge connector in the electrical connector of the mother board, according to an embodiment of the present invention.

FIG. 4 illustrates a tie-wrap which fits onto the base of FIG. 1 and secures the circuit card edge connector in the electrical connector of the mother board, according to an embodiment of the present invention.

DETAILED DESCRIPTION

FIGS. 1 to 7 illustrate a retention mechanism having a base which fits onto an electrical connector of a mother board and which secures an electrical edge connector of a printed circuit card to the connector of the mother board by an extension piece attached to the base. According to alternative embodiments of the present invention, the extension piece can take either the form of a tie-wrap or a retainer clip. The tie-wrap and retainer clip secure the printed circuit card by snapping onto or grasping the circuit card.

Figure 1:
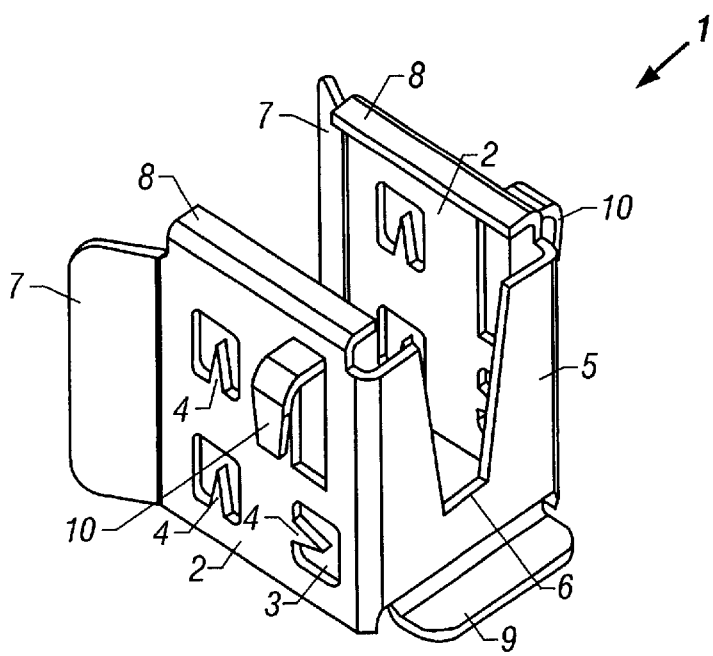
FIG. 1 illustrates a base of the retention mechanism, according to an embodiment of the present invention.
Figure 2:
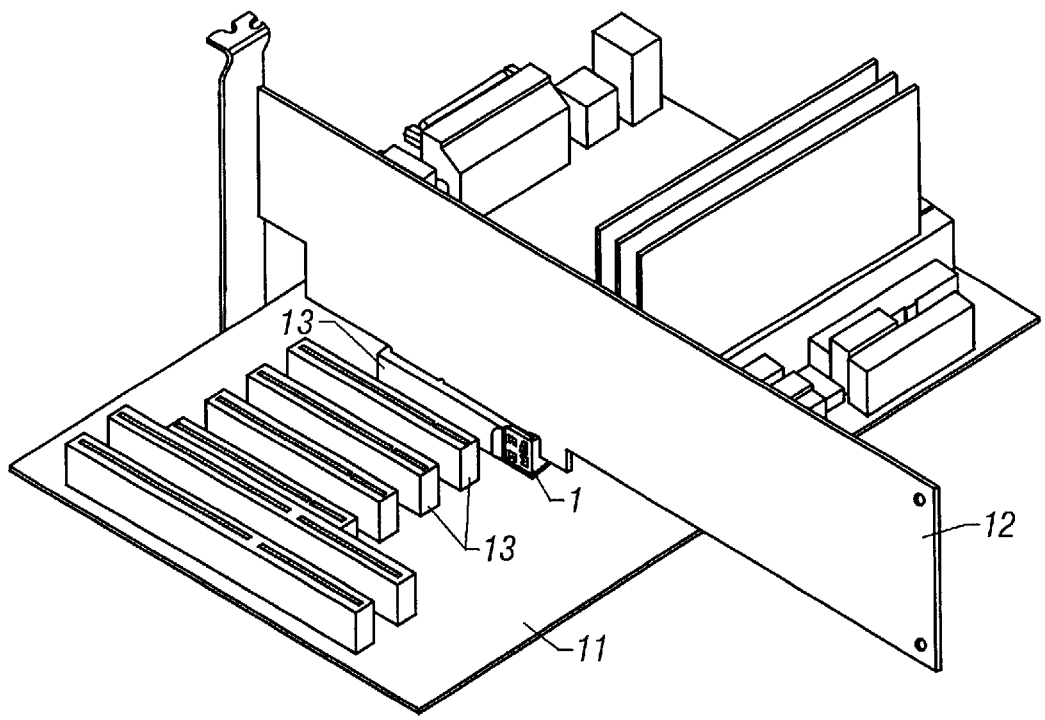
FIG. 2 illustrates the base fitting on an electrical connector of a mother board with a printed circuit card inserted, according to an embodiment of the present invention.

Referring to FIGS. 1 and 2, a base 1 of the retention mechanism fits over and around one end of an electrical connecter 13 of a mother board 11. The base 1 is constructed of a pair of lateral wall pieces 2 diametrically opposed and facing one another, integrally connected by a crosspiece 5 at one end. Each lateral wall piece 2 fits over one side, respectively, of the electrical connector 13, with the crosspiece fitting over an end of the electrical connector 13. It is to be understood, of course, that base 1 can be fitted over either end of the electrical connector 13, and it is not to be limited to the one end as shown in FIG. 2.

The base 1 is secured to the electrical connector by a number of pointed bites 4. The pointed bites 4 extend from each of the diametrically opposed lateral wall pieces 2 into a number of cutouts 3, cut out of the surface of the lateral wall pieces 2, and are flexibly biased towards the electrical connector's outer surface, and as such, "grab" onto the sides of the electrical connecter 13 of the mother board. In this manner then, due to the diametrically opposed grasping forces of the pointed bites 4 from each of the diametrically opposed lateral wall pieces 2, the base 1 is secured to the electrical connecter 13 of the mother board 11. It is to be understood, of course, that the pointed bites 4 may be of any shape, and are not to be limited to the triangular shape as shown in the figures. Further, the pointed bites may have a number of raised protuberances, bumps or ridges (not shown) so as to assist in the "grasping" of the sides of the electrical connecter 13. Also further, it is to be understood, of course, that the cutouts 3 (in which the pointed bites 4 extend) may be of any shape, and are not to be limited to the square shape as shown in the figures. Further, the cutouts 3 need not be cut completely through the wall of the lateral wall pieces 2, but may be cut only partly into the surface of the lateral wall piece, just so that the pointed bites 4 have enough space in which to flex.

To accommodate the proper fitting of the base 1 onto an end of the electrical connector 13 of the motherboard 11, a number of additional features are included to help with installation. First, a lateral guide 7 is integrally connected at one end of each of the lateral wall pieces 2, opposite the end at which the crosspiece 5 is attached. The lateral guides 7 act in conjunction as a pair and are positioned such that each is angled away from opposite sides of the electrical connector 13. Being diametrically angled away from one another, they act as guides to channel the electrical connector between the lateral wall pieces 2 during installation of the base 1 over and around the end of the electrical connector 13. Second, to also further help with proper fitting during installation, a vertical guide 8 is integrally connected at a top of each of the diametrically opposed lateral wall pieces 2. The vertical guides 8 also act in conjunction as a pair and are positioned facing inwardly such that each catches a top of the electrical connector 13 when the base 1 is placed over and around the electrical connector 13. The vertical guides prevent the base 1 from being pushed too far down on the sides of the electrical connector 13, and perhaps damaging the surface of the mother board 11.

To accommodate the proper fitting of the edge connector of the circuit card 12 into the electrical connector 13, the crosspiece 5 which connects the diametrically opposed lateral wall pieces 2, has cut out of it a circuit card accommodation cutout 6. As circuit card 12 is inserted into the electrical connector 13, any extension from the circuit card will be able to fit in the slot created by the circuit card accommodation cutout 6. It is to be understood, of course, that the circuit card accommodation cutout 6 is not to be limited to the shape as shown in the figures, but may be of any shape to adequately accommodate the proper fitting of the circuit card into the electrical connector. Further, to increase the integrity and strength of crosspiece 5, a support piece 9 is integrally connected to crosspiece 5 below accommodation cutout 6. Necessarily, of course, support piece 9 extends out away from crosspiece 5 so as not to strike the surface of the motherboard 11 during installation of the base 1 over and around electrical connector 13 and thereby prevent proper fitting.

In an embodiment of the present invention, base 1 also has integrally connected and extending from the lateral wall pieces 2 a tie-wrap hook 10. The tie-wrap hook 10 extends outwardly and downwardly from the lateral wall piece 2, such that a loop coupling, as will be described in further detail below, can be securely placed over the hook. It is to be understood, of course, that the direction of extension of the tie-wrap hook 10 need not be limited to a downward direction, and that rather any direction suitable for securing the loop coupling over the hook is acceptable. The construction of the tie-wrap hook 10 itself can be such that it is either cut out of the surface of the lateral wall piece 2 and bent into shape, as illustrated, or pre-fabricated and then integrally attached to the surface. It is to be understood, of course, that while a tie-wrap hook 10 is illustrated in FIG. 1 as extending from each of the lateral wall pieces 2, this need not always be the case and rather a tie-wrap hook can extend from neither, one or both of the lateral wall pieces 2 dependent upon the embodiment of the present invention being utilized.

Referring now to FIGS. 3 and 4, two embodiments of a tie-wrap 20, which are utilized in conjunction with the tie-wrap hook 10 of base 1 to secure circuit card 12 in electrical connector 13, are illustrated. The tie-wrap 20 is constructed of three main pieces: a single flexible finger 21, a loop coupling 22 (which is integrally connected to the flexible finger 21 at one end), and a movable locking feature 23 (which has a hollow portion which fits over and around the flexible finger 21). The flexible finger 21 is itself constructed of a single elongated piece which has a bit of flexibility and is designed to run the width of the circuit card 12 to be inserted in the electrical connector 13. A number of serrations extend along the length of the elongated piece approximately from a point near the loop feature 22 to the opposite end of the flexible finger 21, and allow the locking feature 23 to catch at a particular point on the flexible finger 21 (as will be described in further detail below). It is to be understood, of course, that the length of elongated piece of the flexible finger 21 and the serrations which run along it thus allow the tie-wrap 20 to be utilized with printed circuit cards of various widths.

While integrally connected to the flexible finger 21, the loop coupling 22 is constructed having a hole cut through it and may be either square in shape, as shown in FIG. 3, or circular in shape, as shown in FIG. 4. The loop coupling 22 acts to secure the tie-wrap 20 to base 1 by fitting over the tie-wrap hook 10. It is to be understood, of course, that the loop coupling 22 may be of any shape suitable to enable it to fit over tie-wrap hook 10 in a secure fashion.

The locking feature 23 catches the serrations and secures itself to the flexible finger 21 by a releasable latch 24, which extends from locking feature 23 and grabs hold of the serrations of the flexible finger 21. The interaction of the serrations and the releasable latch when engaged act to prevent the locking feature 23 from sliding along the elongated length of the flexible finger 21. As shown in FIG. 3, the releasable latch 24 may extend upwards from the locking feature 23. Alternatively, shown in FIG. 4, releasable latch 24 may be inside of the locking feature 23 so as not to be visible in an extension. It is to be understood, of course, that if the releasable latch 24 is constructed to extend from the locking feature 23, it may extend either upwardly or downwardly from the locking feature.

The locking feature 23 is further constructed to secure the tie-wrap 20 to the circuit card 12. One embodiment of the locking feature 23, as shown in FIG. 3, has a circuit card hook 25 which extends from the main body of the locking feature 23. The circuit card hook 25 is designed to snap fit through a hole cut into the circuit card (not shown in figure) and catch on the backside of the circuit card. It can be released by manually depressing the circuit card hook 25 and removing it from the hole cut into the circuit card. Alternatively, a second embodiment of the locking feature 23, as shown in FIG. 4, has a circuit card holder 26 which extends from the main body of the locking feature 23. The circuit card holder 26 has cut into it on an underside a circuit card slot 27. The top edge of the circuit card (not shown in figure) fits into the circuit card slot 27. In both embodiments, the tie-wrap 20 secures the circuit card 12 to the electrical connector 13 of the mother board 11 by attaching to the base 1 (which itself is already secured to the connector 13) by means of the loop coupling 22 and either hooking or holding the circuit card 12 in place by means of the hook 25 and holder 26, respectively, extending from the locking feature 23. As explained above, locking feature 23 is secured to the flexible finger 21 by means of the interaction between the serrations on the finger and the releasable latch 24.

Figure 5:
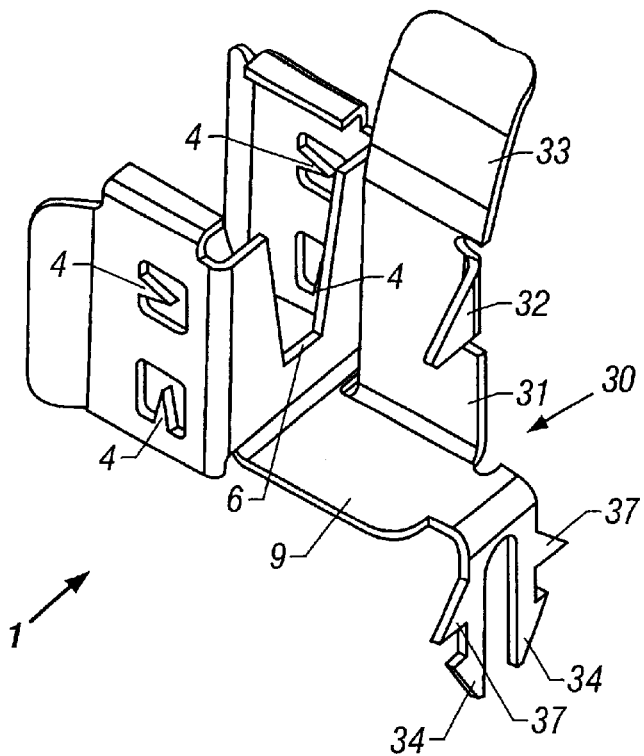
FIG. 5 illustrates the base of FIG. 1 with a retainer clip which secures the circuit card edge connector in the electrical connector of the mother board, according to an embodiment of the present invention.
Figure 6:
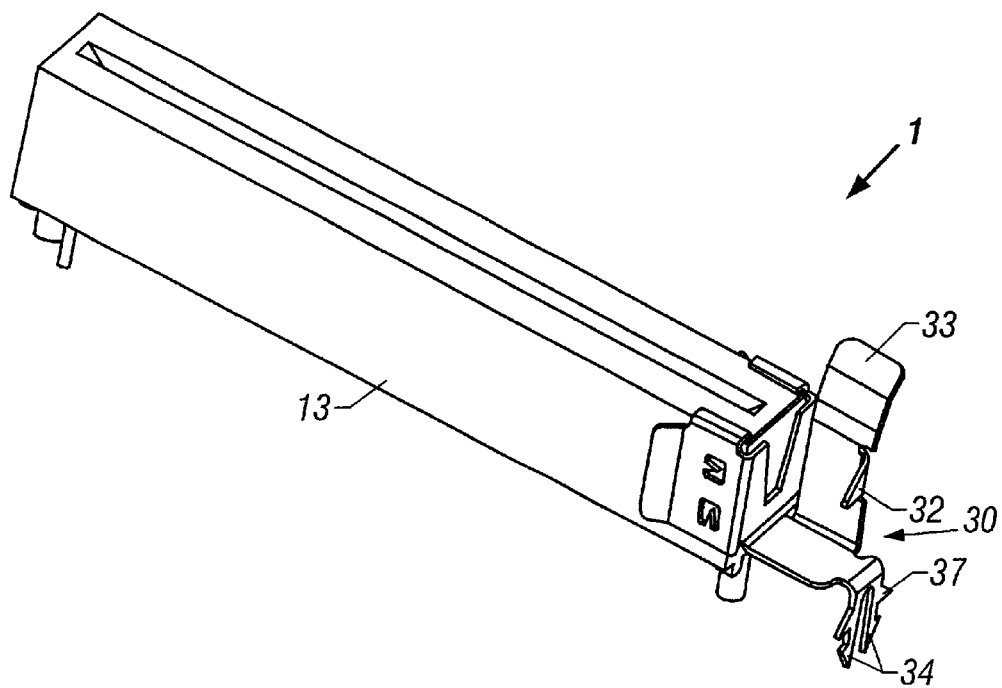
FIG. 6 illustrates the base of FIG. 1 and retainer clip fitting on an electrical connector of a mother board, according to an embodiment of the present invention.
Figure 7:
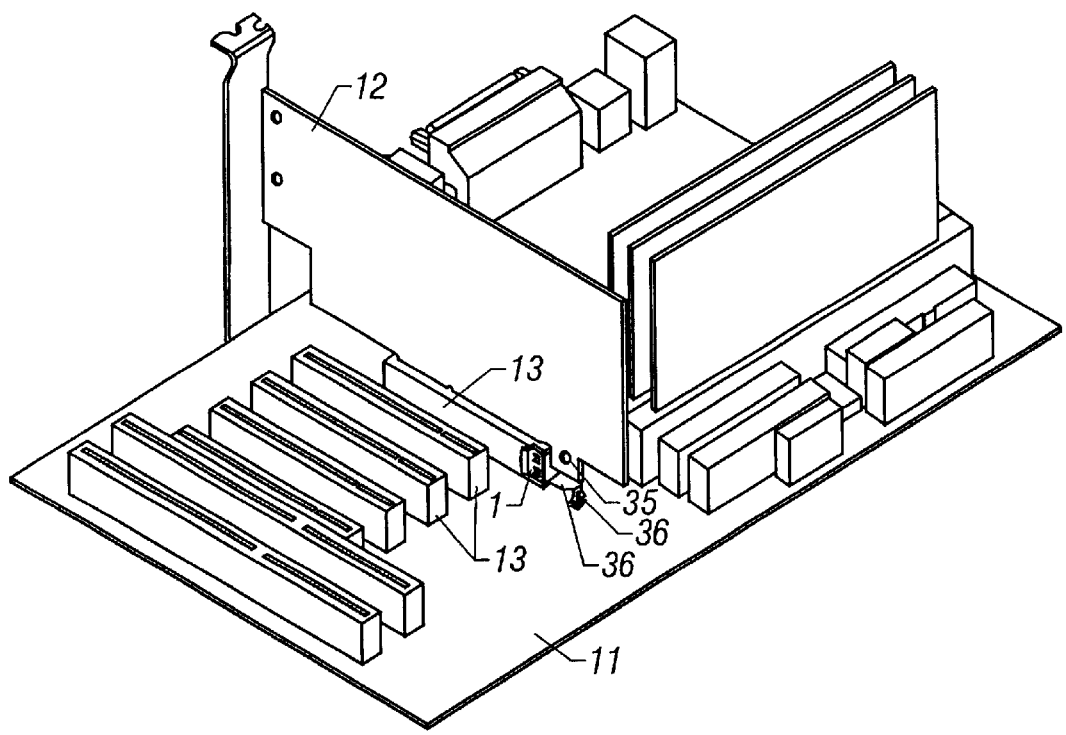
FIG. 7 illustrates the base of FIG. 1 and retainer clip fitting on an electrical connector of a mother board with a printed circuit card edge connector inserted, according to an embodiment of the present invention.

Referring now to FIGS. 5, 6 and 7, another embodiment of the construction of the retention mechanism is shown. In this embodiment, retainer clip 30, which is integrally connected to base 1 by means of support piece 9, secures the circuit card 12 to the electrical connector 13. As shown, support piece 9 is longer and extends further away from base 1 to accommodate retainer clip 30, and base 1 may be constructed without the tie-wrap hook 10. Separate flexible upper and lower portions of the retainer clip 30 act on the circuit card and the motherboard, respectively, to secure them together.

The upper portion, an upper extension 31, extends upward from the support piece 9 and has protruding inwardly from it an upper snap lock 32. The upper snap lock 32 is designed to fit into a circuit card hole 35 cut into the circuit card 12. The top of snap lock 32 can be angled in such a manner as to aid in insertion of the snap lock 32 into the circuit card hole 35, such that when the circuit card 12 is inserted into the electrical connector 13 of the mother board 12, the upper extension 31 bends outward and the snap lock 32 snaps into the hole 35 when it is reached. Thus, when snap lock 32 is properly situated in the circuit card hole 35, the circuit card 12 cannot be lifted out of the electrical connector 13. In this manner then, the base 1 is secured to the circuit card 12, and accordingly, the circuit card 12 is secured to the electrical connecter 13 of the motherboard 11. To aid with insertion and removal of the snap lock 32 into and out of hole 35 (and thereby insertion and removal of the circuit card 12 into and out of the connector 13), a handle 33 is integrally connected to the upper extension 31 such that by manually depressing handle 33, the upper snap lock 32 can be engaged or disengaged from the circuit card hole 35, as the case may be.

The lower portion, lower snap lock 34, extends downward from the support piece 9 in order to further secure base 1 to electrical connecter 13 of mother board 11. Lower snap lock 34 is designed with two flexible digits that snap into a motherboard hole 36 cut into the motherboard 11, and that can be manually manipulated together in order to be released from the mother board hole 36. Like the upper snap lock 32, the two flexible digits of the lower snap lock 34 can be angled in such a manner as to aid in insertion of the snap lock 34 into the hole 36, such that when the base 1 is manipulated over and around the electrical connector 13 and the lower snap lock 34 is inserted in the hole 36, the two flexible digits of the lower snap lock 34 bend inwardly towards one another. When the edge of the angled portion of the digits are reached, the two flexible digits snap into place below the motherboard 11. In such a manner then, the retention mechanism is directly secured to the motherboard 11 by the retainer clip 30. To further help with securing the lower snap lock 34 to the motherboard 11, integrally connected to each one of the flexible digits of lower snap lock 34 are abutments 37. Abutments 37 form a barrier which sit upon an upper surface of the motherboard 11, and thus the edge of the motherboard 11 fits into the slot created between the flexible digits of the lower snap lock 34 and the abutments 37. Also like before, the abutments 37 can be angled in such a manner as to aid in the removal of the lower snap lock 34 from the hole 36. It is to be understood, of course, that the mechanics of the lower snap lock 34 act as an additional means of securing the base 1 to the electrical connector 13 of the motherboard 11, and thus may replace the pointed bites 4 as the securing mechanism, may be used in conjunction with the pointed bites 4, or alternatively do not need to be used at all.

Thus, as can be seen from the above, the circuit card retention mechanism of the present invention can be used in several embodiments to securely hold the printed circuit card to the mother board. Each embodiment of the retention mechanism allows for the secure connection of the electrical edge connecters of the circuit card to the electrical connecter of the mother board. In addition, while the application of the present invention to computer equipment, such as PC's and computer servers, is unmistakable, the present invention may apply to any type of electronic equipment where two discrete printed circuit cards are electrically connected. This includes, but is not limited to, telecommunications equipment such as line interface cards, transceivers, power modules, and switch modules.

It is to be understood and expected that additional variations in the principles of construction herein disclosed may be made by one skilled in the art and it is intended that such modifications, changes, and substitutions are to be included within the scope of the present invention.

What is claimed is:

1. A circuit card retention mechanism, comprising:
   a base which fits over an end on an electrical connector of a motherboard, comprising:
   a pair of lateral wall pieces diametrically opposed and facing one another;
   a crosspiece which integrally connects the pair of lateral wall pieces at an end; and
   a support piece, integrally connected to and extending outwardly from a bottom portion of the crosspiece; and an extension piece which secures to a circuit card and which takes the form of a retainer clip, and wherein the retainer clip further secures to the motherboard.

2. The retention mechanism according to claim 1, wherein the base further comprises:

a pair of lateral guides, each one of which is integrally connected to a different one of the pair of lateral wall pieces at an end opposite the crosspiece and each one of which is positioned at an opposite angle away from the electrical connector.

3. The retention mechanism according to claim 1, wherein the base further comprises:

a pair of vertical guides, each one of which is integrally connected to a different one of the pair of lateral wall pieces at a top portion and each one of which are positioned facing inwardly in different directions towards the electrical connector.

4. A circuit card retention mechanism, comprising:

a base which fits over an end on an electrical connector, comprising:

a pair of lateral wall pieces diametrically opposed and facing one another;

a crosspiece which integrally connects the pair of lateral wall pieces at an end;

a support piece, integrally connected to and extending outwardly from a bottom portion of the crosspiece;

at least one cutout in each one of the pair of lateral wall pieces;

at least one pointed bite positioned in each one of the at least one cutouts and which is flexibly biased towards the electrical connector; and at least one tie-wrap hook integrally connected to and extending from at least one of the pair of lateral wall pieces; and at least one tie-wrap which secures to a circuit card, comprising:

a flexible finger having a number of serrations along its length;

a loop coupling integrally connected to the flexible finger and which fits over the at least one tie-wrap hook; and a locking feature having a hollow through which the flexible finger is inserted, comprising:

a releasable latch for interacting with one of the number of serrations of the flexible finger; and a circuit card hook which snap fits through a hole cut into the circuit card.

5. The retention mechanism according to claim 4, wherein the base further comprises:

a pair of lateral guides, each one of which is integrally connected to a different one of the pair of lateral wall pieces at an end opposite the crosspiece and each one of which is positioned at an opposite angle away from the electrical connector.

6. The retention mechanism according to claim 4, wherein the base further comprises:

a pair of vertical guides, each one of which is integrally connected to a different one of the pair of lateral wall pieces at a top portion and each one of which are positioned facing inwardly in different directions towards the electrical connector.

7. The retention mechanism according to claim 4, wherein the base further comprises:

a circuit card accommodation cutout cut out of the crosspiece and which creates a slot in which a circuit card can fit.

8. A circuit card retention mechanism, comprising:

a base which fits over an end on an electrical connector, comprising:

a pair of lateral wall pieces diametrically opposed and facing one another;

a crosspiece which integrally connects the pair of lateral wall pieces at an end;

a support piece, integrally connected to and extending outwardly from a bottom portion of the crosspiece;

at least one cutout in each one of the pair of lateral wall pieces;

at least one pointed bite positioned in each one of the at least one cutouts and which is flexibly biased towards the electrical connector; and at least one tie-wrap hook integrally connected to and extending from at least one of the pair of lateral wall pieces; and at least one tie-wrap which secures to a circuit card, comprising:

a flexible finger having a number of serrations along its length;

a loop coupling integrally connected to the flexible finger and which fits over the at least one tie-wrap hook; and a locking feature having a hollow through which the flexible finger is inserted, comprising:

a releasable latch for interacting with one of the number of serrations of the flexible finger; and a circuit card holder having cut into it on an underside a slot in which an edge of the circuit card fits.

9. The retention mechanism according to claim 8, wherein the base further comprises:

a pair of lateral guides, each one of which is integrally connected to a different one of the pair of lateral wall pieces at an end opposite the crosspiece and each one of which is positioned at an opposite angle away from the electrical connector.

10. The retention mechanism according to claim 8, wherein the base further comprises:

a pair of vertical guides, each one of which is integrally connected to a different one of the pair of lateral wall pieces at a top portion and each one of which are positioned facing inwardly in different directions towards the electrical connector.

11. The retention mechanism according to claim 8, wherein the base further comprises:

a circuit card accommodation cutout cut out of the crosspiece and which creates a slot in which a circuit card can fit.

12. A circuit card retention mechanism, comprising:

a base which fits over an end on an electrical connector, comprising:

a pair of lateral wall pieces diametrically opposed and facing one another;

a crosspiece which integrally connects the pair of lateral wall pieces at an end;

a support piece, integrally connected to and extending outwardly from a bottom portion of the crosspiece;

at least one cutout in each one of the pair of lateral wall pieces; and at least one pointed bite positioned in each one of the at least one cutouts and which is flexibly biased towards the electrical connector; and a retainer clip integrally connected to the base by the support piece and which secures to a circuit card, comprising:

an upper extension extending upward from the support piece; and a snap lock which protrudes inwardly from the upper extension and which snap fits into a hole cut in the circuit card.

13. The retention mechanism according to claim 12, wherein the base further comprises:

a pair of lateral guides, each one of which is integrally connected to a different one of the pair of lateral wall pieces at an end opposite the crosspiece and each one of which is positioned at an opposite angle away from the electrical connector.

14. The retention mechanism according to claim 12, wherein the base further comprises:

a pair of vertical guides, each one of which is integrally connected to a different one of the pair of lateral wall pieces at a top portion and each one of which are positioned facing inwardly in different directions towards the electrical connector.

15. The retention mechanism according to claim 12, wherein the base further comprises:

a circuit card accommodation cutout cut out of the crosspiece and which creates a slot in which a circuit card can fit.

16. The retention mechanism according to claim 12, wherein the retainer clip further comprises:

a handle integrally connected to the upper extension and which may be manually manipulated to release the snap lock from the hole cut in the circuit card.

17. The retention mechanism according to claim 12, wherein the snap lock is angled in such a manner as to aid in the insertion of the snap lock into the hole cut in the circuit card.

18. The retention mechanism according to claim 12, wherein the retainer clip also secures to a motherboard and further comprises:

a lower snap lock, which extends downwardly from the support piece and which snap fits into a hole cut in the motherboard, comprising:

a pair of flexible digits; and a pair of abutments, each one of which is integrally connected to a different one of the pair of flexible digits so as to create a slot into which an edge of the motherboard fits.

19. The retention mechanism according to claim 12, wherein the retainer clip also secures to a motherboard and further comprises:

a lower snap lock, which extends downwardly from the support piece and which snap fits into a hole cut in the motherboard.

20. A circuit card retention mechanism, comprising:

a base which fits over an end on an electrical connector, comprising:

a pair of lateral wall pieces diametrically opposed and facing one another;

a crosspiece which integrally connects the pair of lateral wall pieces at an end, and a support piece, integrally connected to and extending outwardly from a bottom portion of the crosspiece; and a retainer clip integrally connected to the base by the support piece and which secures to a circuit card and a motherboard, comprising:

an upper extension extending upward from the support piece;

a snap lock which protrudes inwardly from the upper extension and which snap fits into a hole cut in the circuit card; and a lower snap lock, which extends downwardly from the support piece and which snap fits into a hole cut in the motherboard.

21. The retention mechanism according to claim 20, wherein the base further comprises:

a pair of lateral guides, each one of which is integrally connected to a different one of the pair of lateral wall pieces at an end opposite the crosspiece and each one of which is positioned at an opposite angle away from the electrical connector.

22. The retention mechanism according to claim 20, wherein the base further comprises:

a pair of vertical guides, each one of which is integrally connected to a different one of the pair of lateral wall pieces at a top portion and each one of which are positioned facing inwardly in different directions towards the electrical connector.

23. The retention mechanism according to claim 20, wherein the base further comprises:

a circuit card accommodation cutout cut out of the crosspiece and which creates a slot in which a circuit card can fit.

24. The retention mechanism according to claim 20, wherein the retainer clip further comprises:

a handle integrally connected to the upper extension and which may be manually manipulated to release the snap lock from the hole cut in the circuit card.

25. The retention mechanism according to claim 20, wherein the snap lock is angled in such a manner as to aid in the insertion of the snap lock into the hole cut in the circuit card.

26. The retention mechanism according to claim 20, wherein the lower snap lock further comprises:

a pair of flexible digits; and a pair of abutments, each one of which is integrally connected to a different one of the pair of flexible digits so as to create a slot into which an edge of the motherboard fits.

27. A circuit card retention mechanism, comprising:

a base which fits over an end on an electrical connector of a motherboard, comprising:

a pair of lateral wall pieces diametrically opposed and facing one another;

a crosspiece which integrally connects the pair of lateral wall pieces at an end; and a support piece, integrally connected to and extending outwardly from a bottom portion of the crosspiece; and an extension piece which secures to a circuit card and which takes the form of a tie-wrap, wherein the base further comprises:

at least one cutout in each one of the pair of lateral wall pieces; and at least one pointed bite positioned in each one of the at least one cutouts and which is flexibly biased towards the electrical connector.

28. The retention mechanism according to claim 27, wherein the base further comprises:

a pair of lateral guides, each one of which is integrally connected to a different one of the pair of lateral wall pieces at an end opposite the crosspiece and each one of which is positioned at an opposite angle away from the electrical connector.

29. The retention mechanism according to claim 27, wherein the base further comprises:

a pair of vertical guides, each one of which is integrally connected to a different one of the pair of lateral wall pieces at a top portion and each one of which are positioned facing inwardly in different directions towards the electrical connector.

* * * * *